United States Patent
Randazzo (10) Patent No.: US 6,194,766 B1
(45) Date of Patent: Feb. 27, 2001

(54) INTEGRATED CIRCUIT HAVING LOW VOLTAGE AND HIGH VOLTAGE DEVICES ON A COMMON SEMICONDUCTOR SUBSTRATE

(75) Inventor: Todd A. Randazzo, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/495,512

(22) Filed: Feb. 1, 2000

Related U.S. Application Data (62) Division of application No. 09/006,918, filed on Jan. 13, 1998.

(51) Int. Cl.⁷ .................................................. H01L 29/72
(52) U.S. Cl. .................... 257/371; 257/374; 257/396; 257/400; 257/402
(58) Field of Search ................................. 257/371, 374, 257/396, 400, 402

(56) References Cited

U.S. PATENT DOCUMENTS

| | | | |
|---|---|---|---|
| 4,181,537 | 1/1980 | Ichinohe | 438/297 |
| 4,240,092 | 12/1980 | Kuo | 257/296 |
| 4,350,536 | 9/1982 | Nakano et al. | 438/252 |
| 4,391,032 | 7/1983 | Schulte | 438/251 |
| 4,411,058 | 10/1983 | Chen | 438/218 |
| 4,442,591 | 4/1984 | Haken | 438/226 |
| 4,466,177 | 8/1984 | Chao | 438/251 |
| 4,472,871 | 9/1984 | Green et al. | 438/276 |
| 4,527,180 | 7/1985 | Oto | 257/532 |
| 4,558,508 | 12/1985 | Kinney et al. | 438/401 |
| 4,590,663 | 5/1986 | Haken | 438/231 |
| 4,613,883 | 9/1986 | Tihanyi | 257/296 |
| 4,613,885 | 9/1986 | Haken | 257/377 |
| 4,622,570 | 11/1986 | Taguchi | 257/310 |
| 4,626,450 | 12/1986 | Tani et al. | 438/220 |
| 4,639,274 | 1/1987 | Krishna | 438/396 |
| 4,677,739 | 7/1987 | Doering et al. | 438/228 |

(List continued on next page.)

FOREIGN PATENT DOCUMENTS

| | | | |
|---|---|---|---|
| 27 24 165 | 12/1977 | (DE) . | |
| 0 114 491 A1 | 8/1984 | (EP) . | |
| 0 217 525 A1 | 4/1987 | (EP) . | |
| 0 462 040 A1 | 12/1991 | (EP) . | |
| 58-219760 | 12/1983 | (JP) . | |
| 59-127858 | 7/1984 | (JP) . | |
| 62-060263 | 3/1987 | (JP) . | |
| 2-056963 | 2/1990 | (JP) . | |
| 4-206770 | 7/1992 | (JP) . | |
| 4218972 | 8/1992 | (JP) | 257/371 |
| 5-102478 | 4/1993 | (JP) . | |
| 5-121436 | 5/1993 | (JP) . | |
| 621374 | 1/1994 | (JP) | 257/371 |
| 9-036243 | 2/1997 | (JP) . | |

*Primary Examiner*—Edward Wojciechowicz

(57) ABSTRACT

High voltage and low voltage devices are provided on a common semiconductor substrate. An integrated semiconductor circuit includes a semiconductor substrate of a first conductivity type. Well regions of a first conductivity type and well regions of a second conductivity type are formed in the substrate. Low voltage devices are formed in well regions of the first conductivity type. A high voltage device includes source/drain regions of the second conductivity type formed, respectively, in well regions of the second conductivity type, an oxide region disposed on a surface of the substrate located above a region of the substrate that serves as a channel for the high voltage device, and a gate region disposed on the oxide region.

11 Claims, 12 Drawing Sheets

U.S. PATENT DOCUMENTS

| | | | |
|---|---|---|---|
| 4,697,332 | 10/1987 | Joy et al. | 438/420 |
| 4,717,683 | 1/1988 | Parrillo | 438/451 |
| 4,735,915 | 4/1988 | Kita et al. | 438/250 |
| 4,866,002 | 9/1989 | Shizukuishi et al. | 438/217 |
| 4,889,825 | 12/1989 | Parrillo | 438/443 |
| 4,896,243 | 1/1990 | Chatterjee et al. | 361/56 |
| 4,929,565 | 5/1990 | Parrillo | 438/443 |
| 5,014,105 | 5/1991 | Hata et al. | 257/371 |
| 5,024,960 | 6/1991 | Haken | 438/200 |
| 5,047,358 | 9/1991 | Koziak et al. | 438/200 |
| 5,097,310 | 3/1992 | Eimori et al. | 257/371 |
| 5,108,937 | 4/1992 | Tsai et al. | |
| 5,182,225 | 1/1993 | Matthews | 438/202 |
| 5,252,510 | 10/1993 | Lee et al. | 438/401 |
| 5,254,487 | 10/1993 | Tamagawa | 438/217 |
| 5,285,995 | 2/1994 | Malhi | 257/343 |
| 5,382,820 | 1/1995 | Yang et al. | 257/371 |
| 5,413,944 | 5/1995 | Lee | 438/228 |
| 5,416,038 | 5/1995 | Haue et al. | 438/228 |
| 5,429,958 | 7/1995 | Matlock | 438/216 |
| 5,432,114 | 7/1995 | O | 438/275 |
| 5,438,005 | 8/1995 | Jang | 438/220 |
| 5,449,637 | 9/1995 | Saito et al. | 438/227 |
| 5,468,666 | 11/1995 | Chapman | 438/226 |
| 5,472,887 | 12/1995 | Hutter et al. | 438/231 |
| 5,473,183 | 12/1995 | Yonemoto | 257/371 |
| 5,495,122 | 2/1996 | Tada | 257/392 |
| 5,497,021 | 3/1996 | Tada | 257/369 |
| 5,506,438 | 4/1996 | Haue et al. | 257/376 |
| 5,517,046 | 5/1996 | Hsing et al. | 257/336 |
| 5,527,722 | 6/1996 | Hutter et al. | 438/231 |
| 5,541,123 | 7/1996 | Williams et al. | 438/202 |
| 5,541,125 | 7/1996 | Williams et al. | 438/202 |
| 5,541,435 | 7/1996 | Beasom | 257/409 |
| 5,545,577 | 8/1996 | Trada | 438/232 |
| 5,547,880 | 8/1996 | Williams et al. | 438/420 |
| 5,548,147 | 8/1996 | Mei | 257/333 |
| 5,559,044 | 9/1996 | Williams et al. | 438/234 |
| 5,573,963 | 11/1996 | Sung | 438/217 |
| 5,576,570 | 11/1996 | Oshawa et al. | 257/369 |
| 5,578,855 | 11/1996 | Gaffur et al. | 257/371 |
| 5,583,061 | 12/1996 | Williams et al. | 438/275 |
| 5,585,660 | 12/1996 | Mei | 257/389 |
| 5,618,743 | 4/1997 | Williams et al. | 438/203 |
| 5,622,885 | 4/1997 | Merrill et al. | 438/226 |
| 5,650,341 | 7/1997 | Yang et al. | 438/217 |
| 5,663,086 | 9/1997 | Rostoker et al. | 438/228 |
| 5,739,572 | 4/1998 | Noguchi | 257/371 |
| 5,814,866 | 9/1998 | Borland | 257/369 |
| 5,821,589 | 10/1998 | Borland | 257/369 |
| 5,850,360 * | 12/1998 | Vajana et al. | 257/371 |
| 5,856,696 * | 12/1999 | Blanchard | 257/371 |

* cited by examiner

INTEGRATED CIRCUIT HAVING LOW VOLTAGE AND HIGH VOLTAGE DEVICES ON A COMMON SEMICONDUCTOR SUBSTRATE

CROSS REFERENCE TO RELATED APPLICATIONS

This application is a divisional of Ser. No. 09/006,918, filed Jan. 13, 1998.

BACKGROUND OF THE INVENTION

The present invention relates generally to integrated metal oxide semiconductor (MOS) devices and, in particular, to combining high voltage and low voltage devices on a single semiconductor substrate.

Refinements in the design and fabrication of integrated circuits (ICs) have provided circuits having more than one million transistors. With continued research and development, the microelectronics industry continues to push transistor densities even higher. One consequence of increasing transistor densities is that device operating voltages are generally getting lower. Whereas, older transistor-transistor logic (TTL) circuits were designed to operate at 5 volts (v), newer circuits such as memory devices and central processing units (CPU) are being designed to operate at 3.3v, 2.5v, and 1.8v.

SUMMARY OF THE INVENTION

The invention generally provides methods and apparatus to fabricate high voltage transistors (operating for example at approximately 12 volts and above) on a substrate of higher density, low voltage (operating for example at approximately 5 volts and below) devices. In one embodiment, a high voltage transistor is fabricated on a substrate of low voltage devices without any additional photolithographic or process steps. In other embodiments, photolithographic and process steps are added to allow operational refinements of the high voltage transistor.

Including high voltage and low voltage devices on a common substrate allows the fabrication of integrated circuits having increased functionality at a reduced cost over (functionally) equivalent combinations of circuits, some incorporating high voltage devices and some incorporating low voltage devices. Examples of high voltage circuits that can be implemented on a substrate of predominately low voltage devices in accordance with the invention include, but are not limited to: (1) on-chip programming devices for use in programmable read-only memory devices; (2) high voltage sense circuits; (3) liquid crystal display drivers; (4) servo control circuits; and (5) disk drive read channel circuitry. Other features and advantages of the invention will become apparent from the following detailed description.

DETAILED DESCRIPTION

New low voltage devices are more susceptible to high voltage signals that prior devices. For example, a circuit implemented in 1.8v technology can be damaged when exposed to a high voltage signal, i.e., a signal of approximately 12v and above. It would be beneficial to integrate both low voltage and high voltage/drive capability into a single circuit on a single substrate. The combined integration of low and high voltage devices would make possible the design and manufacture of complete functional circuits; circuits having both logic and direct input-output (I/O) control capability.

Recent complimentary metal oxide semiconductor (CMOS) technology advances have focused on using energy implant technology to form retrograde twin-well structures within which devices are constructed. Retrograde twin-well technology is characterized by reduced well thermal drives, well defined well edges, thinner field oxide requirements, reduced well-to-well spacing design rules, and greater accuracy and flexibility in defining the n-well/p-well doping profiles. Retrograde twin-well processing technology may be exploited to fabricate high voltage transistors (designed to operate at approximately 12v and above) on a substrate predominantly populated with devices designed to operate at approximately 5v and below.

While detailed embodiments of the present invention are described, it should be understood that the disclosed embodiments are merely exemplary of the invention. The details disclosed herein are not to be interpreted as limiting, but merely as the basis of the claims and as a basis for teaching one skilled in the art how to make and/or use the claimed invention.

Figure 1:
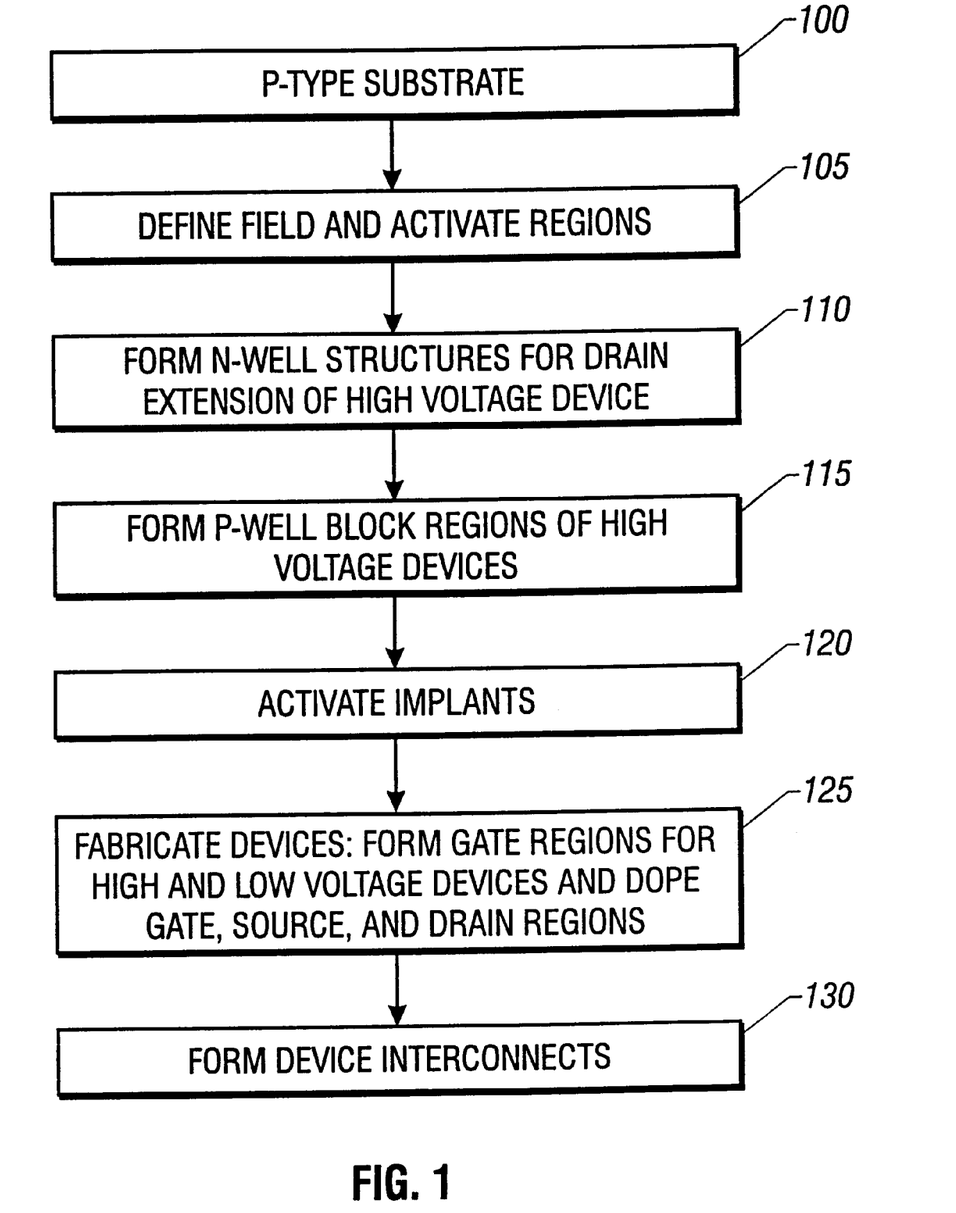
FIG. 1 shows a high voltage device fabrication process flow.
Figure 2A:
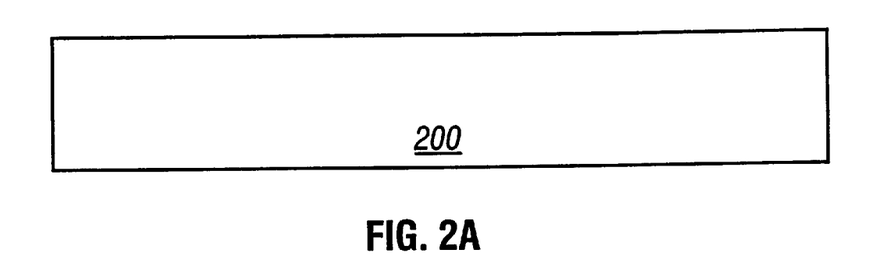
FIGS. 2A through 2D illustrate semiconductor substrate cross-sections corresponding to the process flow of FIG. 1.
Figure 2B:
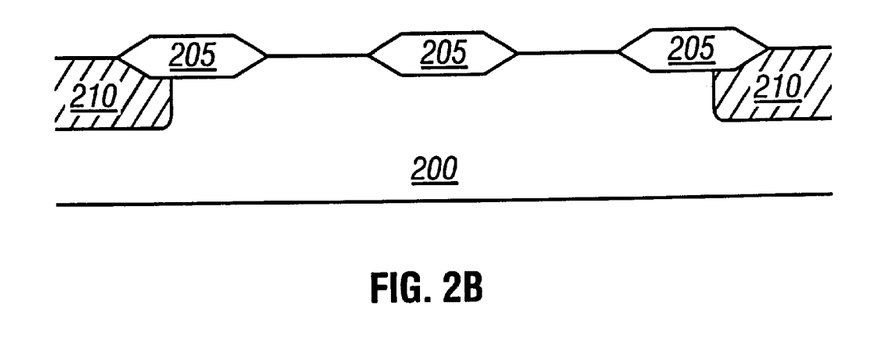
Figure 2C:
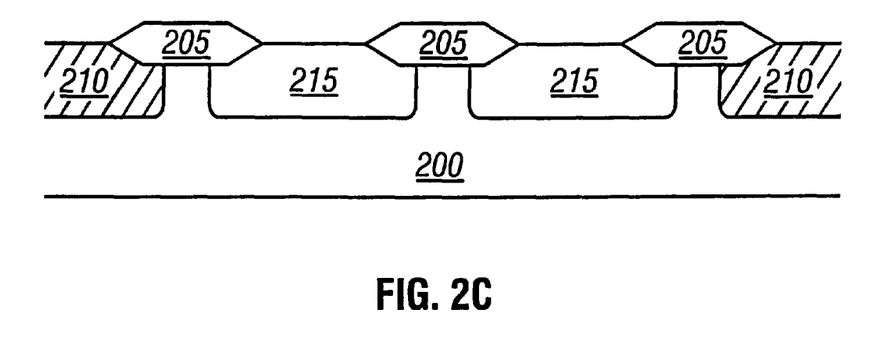
Figure 2D:
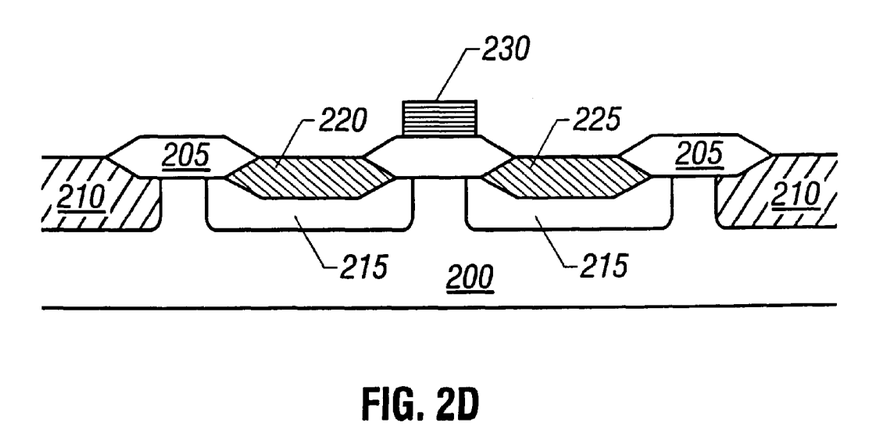

FIGS. 1 and 2 illustrate formation of a high voltage NMOS device in a p-type substrate having low voltage devices. FIG. 1 shows an illustrative process flow and FIG. 2 substrate cross-sections corresponding to some of the process flow steps of FIG. 1. High voltage device fabrication begins with a p-type substrate (step 100, element 200) having an ionic concentration of approximately $5e^{14}$ to $5e^{15}$ Boron (B) atoms/cm$^3$. Field and active regions of both the high voltage and low voltage devices are defined using an isolation technology (step 105). Suitable isolation technologies include local oxidation of silicon (LOCOS) and its variants such as semirecessed, sidewall-masked isolation (SWAMI), self-aligned planar-oxidation technology (SPOT), sealed-interface local oxidation (SILO), and fully recessed oxide (FUROX) as well as non-LOCOS techniques such as trench technology. FIG. 2 illustrates a general LOCOS technique using a field oxide 205 of silicon dioxide (SiO$_2$), typically 2000 Å to 5000 Å thick. P-well regions 210 may be used to form low voltage devices.

Following isolation, n-well structures 215 are formed in the substrate (step 110) to provide high voltage device drain extensions and regions in which low voltage p-type devices can be formed. N-well regions 215 may be formed using one or more energy implants. For example, a first implant of arsenic (As) or phosphorous (P) at 50 KeV to 200 KeV (preferably 100 KeV), followed by a second implant of As and/or P at 250 KeV to 700 KeV (preferably 400 KeV), followed by a third implant of As and/or P at 500 KeV to 2 MeV, preferably 800 KeV, may be designed to create a retrograde n-well having approximately $2e^{11}$ to $2e^{13}$ ions/cm$^2$. An additional layer of photoresist (not shown in FIG. 2) may be used to shield areas of the substrate where no implantation is desired.

For additional isolation between the low and high voltage devices a p-well block can be constructed (step 115). The p-well block does not require an additional process step (e.g., implantation), but rather a change in existing low voltage device p-well masking to ensure a physical separation between low voltage device p-wells and adjacent high voltage device n-wells. Thus, p-well blocks are formed during low voltage device p-well formation at no additional process cost. The p-well block ensures there are three distinct regions at the surface of the substrate: p-well; n-well; and bulk. The electrically decoupled bulk regions (i.e., the bulk regions are not used to set any electrical characteristic of the low voltage devices) enable formation of useful and stable high voltage devices.

P-well block formation (step 115) is followed by a relatively short and low temperature anneal phase designed to activate the implantation regions (step 120). A typical activation anneal uses an 850 C. to 1000 C. bake for 15 to 60 minutes. The anneal's relatively low temperature and short time period limits the lateral diffusion of the implanted ions, resulting in relatively sharp well edges and well ionic concentration of approximately $1e^{16}$ to $5e^{17}$ ions/cm$^3$.

High voltage gate regions 230 are formed and source 220, drain 225, and gate 230 regions are doped in the normal course and at the same time as the source, drain, and gate structures of the substrate's low voltage devices (step 125). Source 220 and drain 225 regions can be n+ regions by implantation of As and/or P ions at a dose of approximately $1e^{15}$ to $6e^{15}$ ions/cm$^2$ to yield a concentration of approximately $1e^{20}$ ions/cm$^3$. Gate structure 230 can be made of polysilicon and is typically 1700 Å to 4000 Å thick. During low voltage device fabrication, field oxide 205 is preferably made as thick as practical yet thin enough to support the desired low voltage device spacing (e.g., design rules). Generally, as gate oxide thickness decreases a high voltage devices drive capacity increases while stray capacitance associated with the low voltage devices' increases. The increased capacitance can limit the operational speed of the low voltage devices. The high voltage device's threshold voltage ($V_{th}$) may be adjusted by the silicon band-gap voltage (approximately 1.2 volts) by using either n+ or p+ material for the gate structure instead of polysilicon.

Finally, conductive paths are formed to allow use of both the high voltage and low voltage devices (step 130). Materials suitable for forming device interconnections include, but are not limited to, aluminum (Al), molybdenum (Mo), tungsten (W), titanium nitride (TiN), and titanium-tungsten combinations (Ti:W).

Figure 3A:
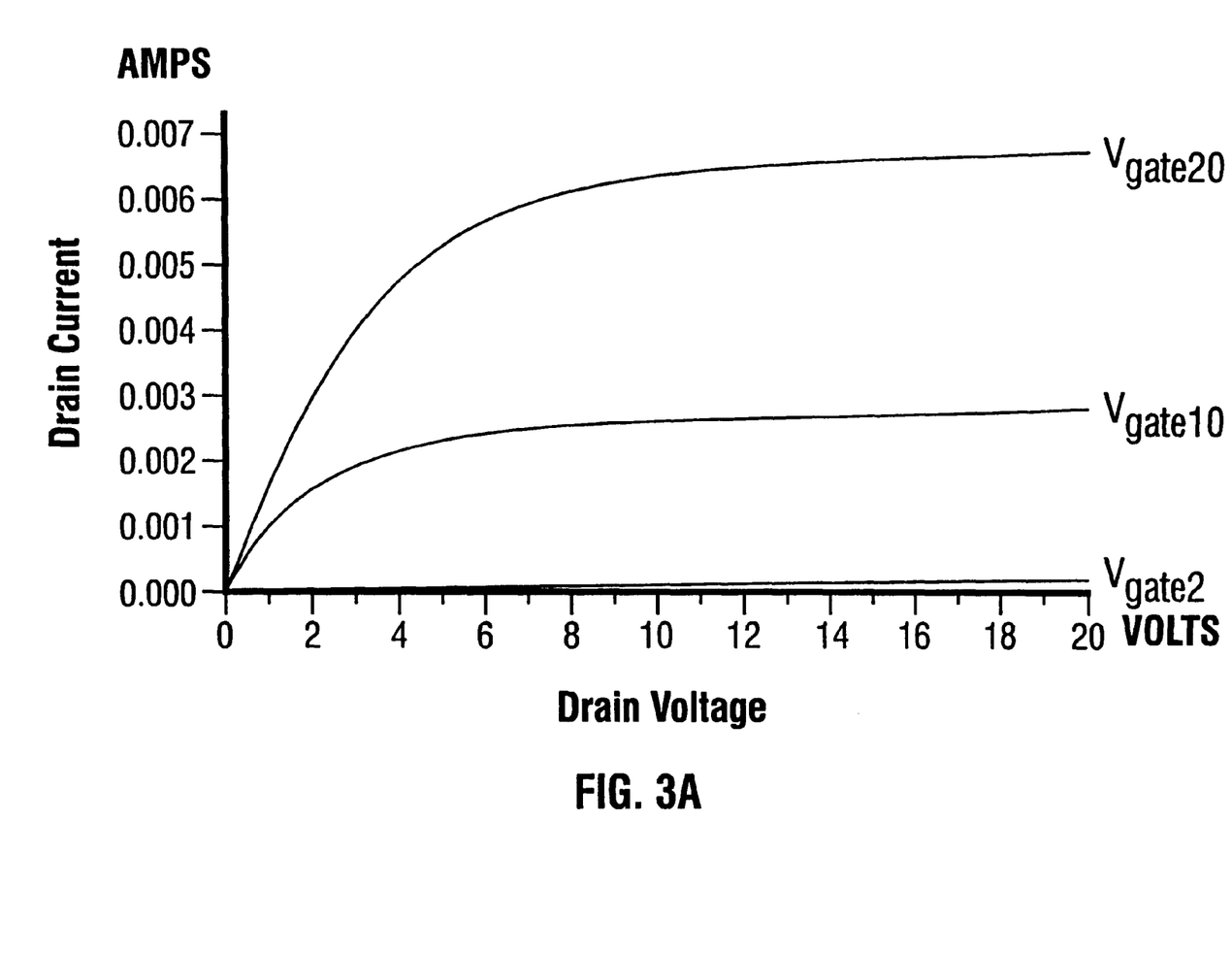
FIGS. 3A and 3B show test data for one illustrative high voltage device.
Figure 3B:
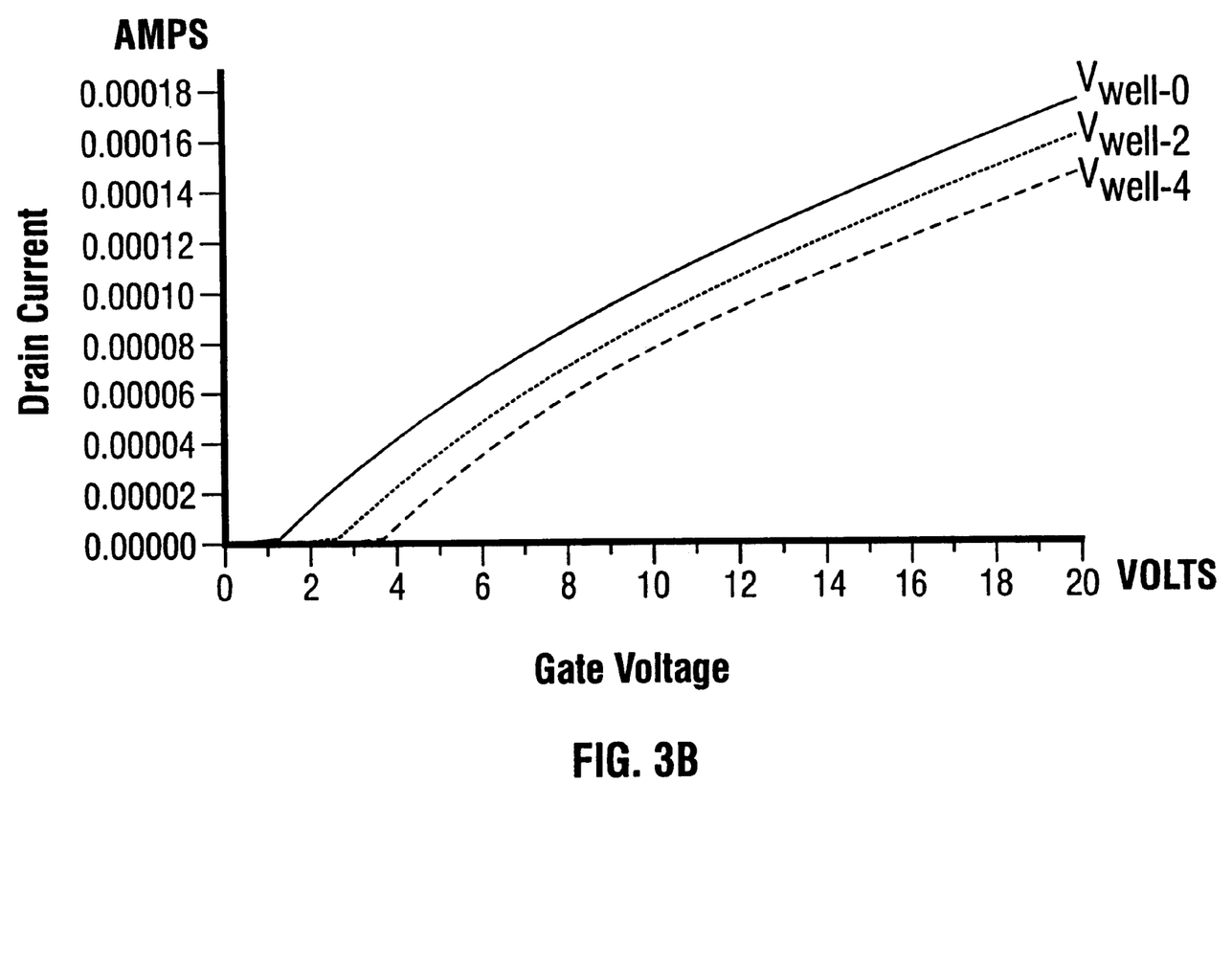

FIGS. 3A and 3B show test data for a high voltage device having an approximately 50 µm channel width and an approximately 5 µm channel length. The substrate's low voltage device characteristics were as follows: gate breakdown voltage of approximately 7.5 volts; drain breakdown voltage of approximately 6.0 volts; device operating voltage of approximately 3.3 volts; device-to-device spacing of approximately 0.6 µm; and a gate oxide thickness of approximately 70 Å. As shown, no aberrant behavior (breakdown, snap-back, or punch-through) was detected even at high voltage device gate voltages of 20 volts and well voltages (bulk voltage to source voltage) of 4 volts.

A high voltage device in accordance with FIGS. 1, 2, and 3 may be used to, for example, implement a circuit for sensing high voltage signals and/or for generating drive currents in excess of 6 mA per device without negatively impacting the operational characteristics of the low voltage devices or incurring any additional processing steps. Several high voltage devices may be combined to implement circuits having output drive capability in excess of 50 mA without requiring large amounts of substrate area. The low voltage devices could be used to implement any desired conventional functional circuit such as a microprocessor or a disk drive control unit.

Figure 4:
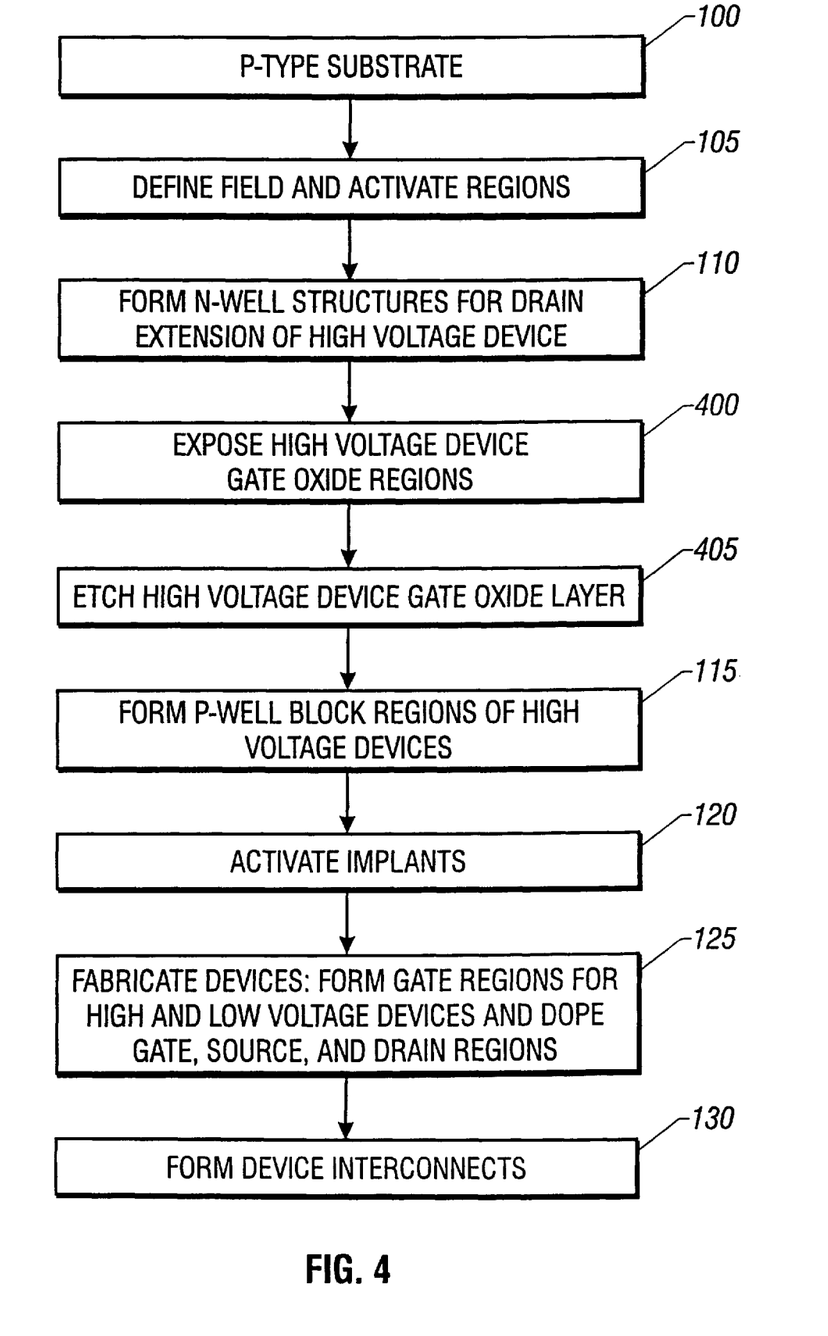
FIG. 4 shows another high voltage device fabrication process flow.
Figure 5A:
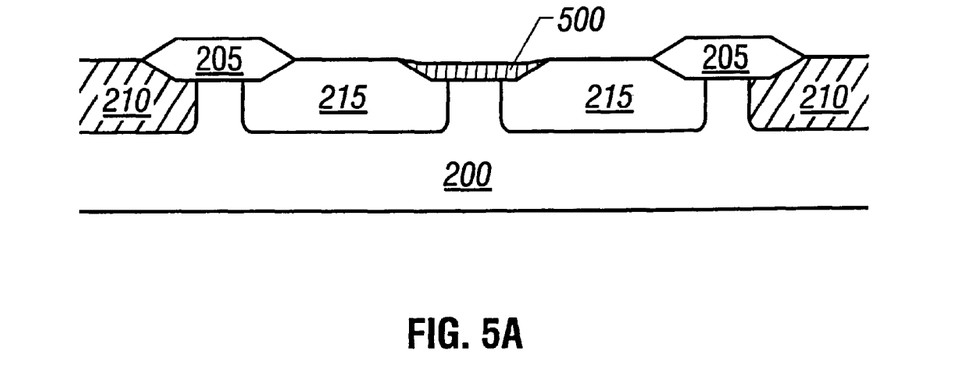
FIGS. 5A and 5B illustrate semiconductor substrate cross-sections corresponding to the process flow of FIG. 4.
Figure 5B:
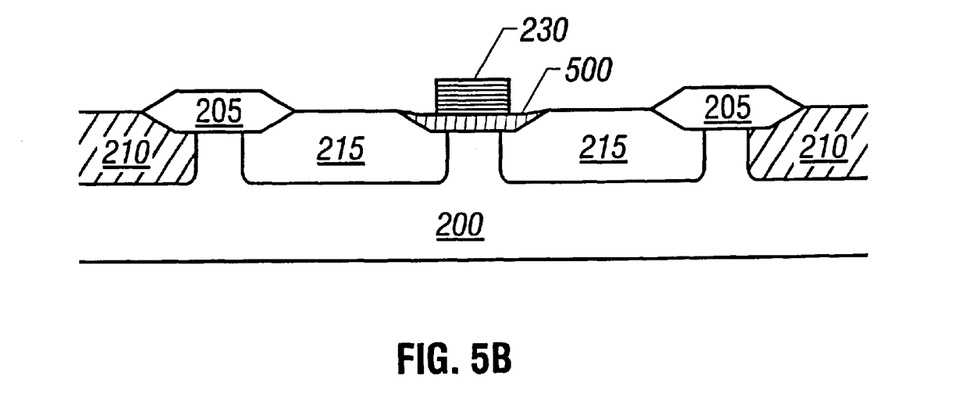

Referring to FIGS. 4 and 5, an alternative embodiment is shown which uses an additional mask to expose the high voltage device gate oxide region (step 400) and a timed etch (step 405) to selectively reduce the gate oxide's thickness 500. With the addition of this one operation (one mask to open a photoresist window over the high voltage device's gate oxide and one etch), the drive capacity of the high voltage device may be increased approximately five times without affecting low voltage device characteristics. The etch (step 405) may be performed, for example, by a timed buffered oxide etch (BOE) or buffered hydrofluoric acid (HF) etch. The precise time of the etch depends at least upon the gate oxide's initial thickness and concentration of the etchant (e.g., HF). The gate oxide 500 may be taken as thin as desired (within control limits of the timed etch), typically 400 Å to 1000 Å. The effect of this operation is to increase high voltage device transconductance which, also has the effect of reducing the high voltage device's gate breakdown voltage. For a gate oxide thickness of 400 Å, the high voltage device gate breakdown voltage is in excess of 40 volts. This embodiment retains all of the advantages, and can be modified in the same manner, as the prior embodiment while incurring only a minimal added fabrication cost.

Figure 6:
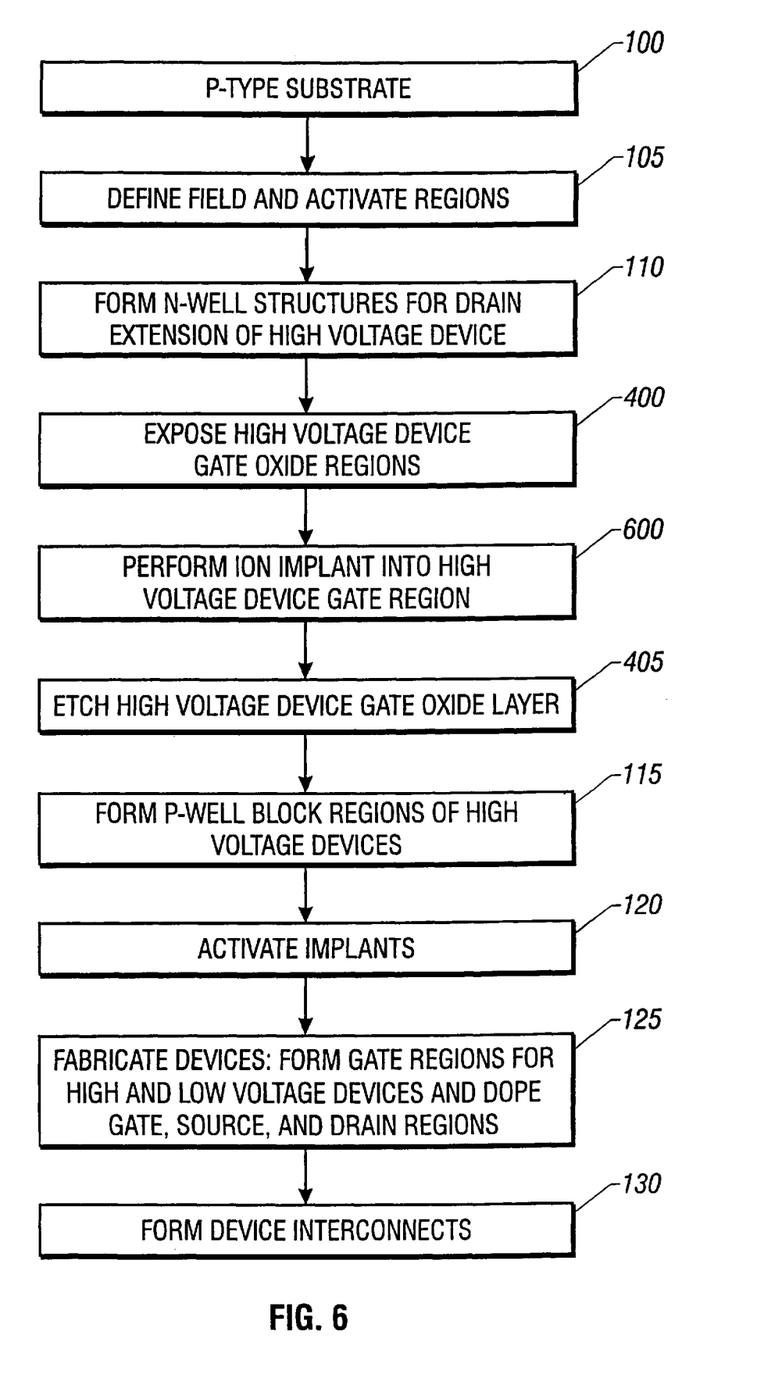
FIG. 6 shows another high voltage device fabrication process flow.
Figure 7:
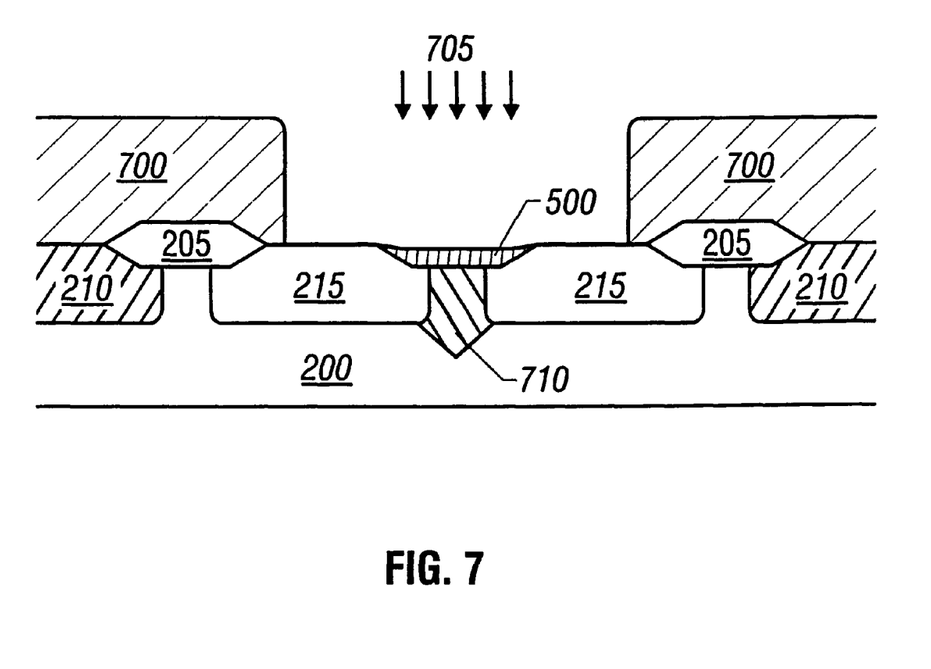
FIG. 7 illustrates a semiconductor substrate cross-section corresponding to the process flow of FIG. 6.

Referring to FIGS. 6 and 7, the prior embodiment is modified to provide a high voltage device gate implantation step (600) after the gate oxide has been exposed (step 400) but before it has been etched (step 405). Implant energies may be between approximately $1e^{11}$ to $1e^{12}$ ions/cm$^2$, generally using B or boron-fluoride (BF$_2$) ions. Shallow implantation energies of approximately 100 KeV to 200 KeV, and deep implantation energies of approximately 100 KeV to 1 MeV may be used. Gate region implantation may also be performed before the gate etch (step 405) and, if so, implantation energies as low as 25 KeV for a shallow implant, and 300 KeV for a deep implant may be used. If the modified p-type gate material 710 is annealed at the same time the source and drain regions are annealed (step 120), no additional processing is necessary. Gate region implantation (step 600 and region 705) can allow the high voltage device source and drain regions to be more closely spaced which, in turn, tends to reduce the effect of the device's channel length and increases the high voltage device's current drive capability. Implantation (step 600) also allows an increased flexibility in setting the high voltage device's electrical characteristics, such as its threshold voltage.

Figure 8:
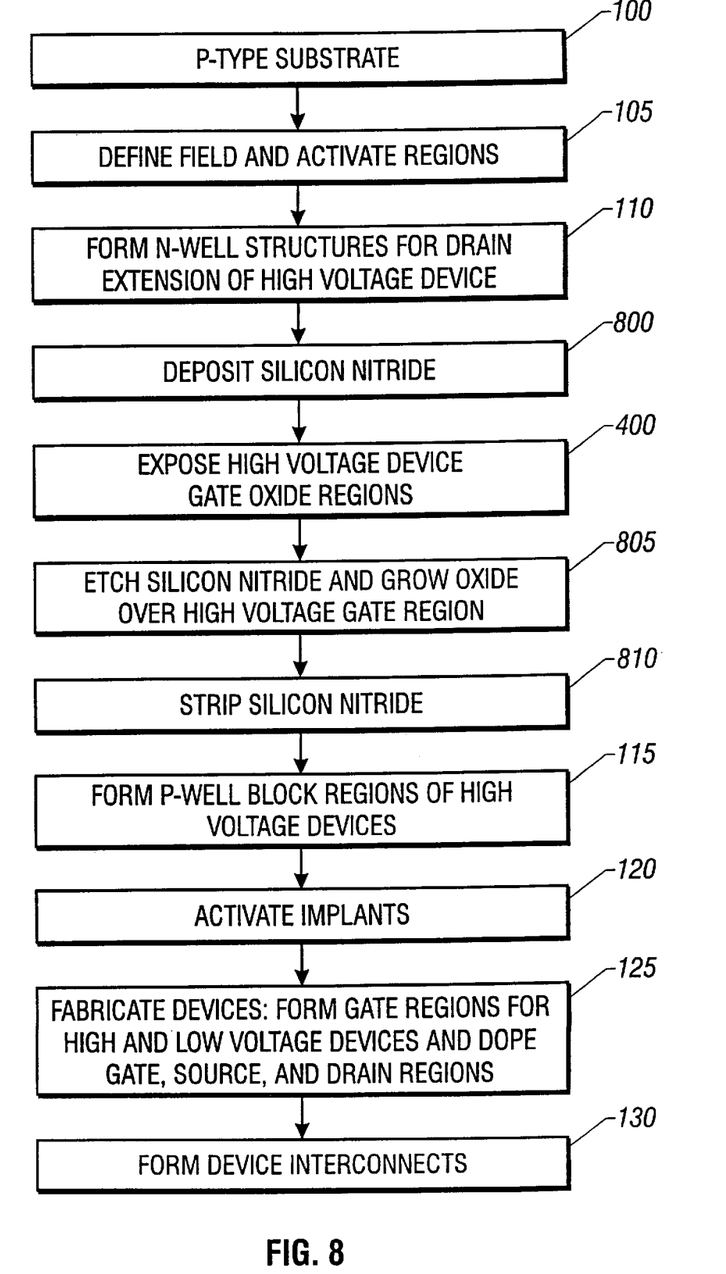
FIG. 8 shows another high voltage device fabrication process flow.
Figure 9A:
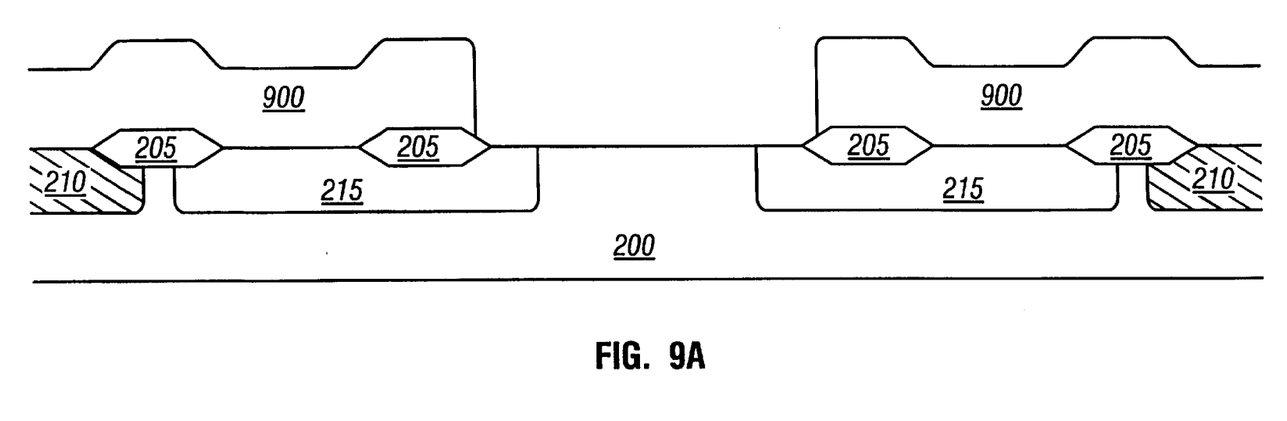
FIGS. 9A and 9B illustrate semiconductor substrate cross-sections corresponding the process flow of FIG. 8.
Figure 9B:
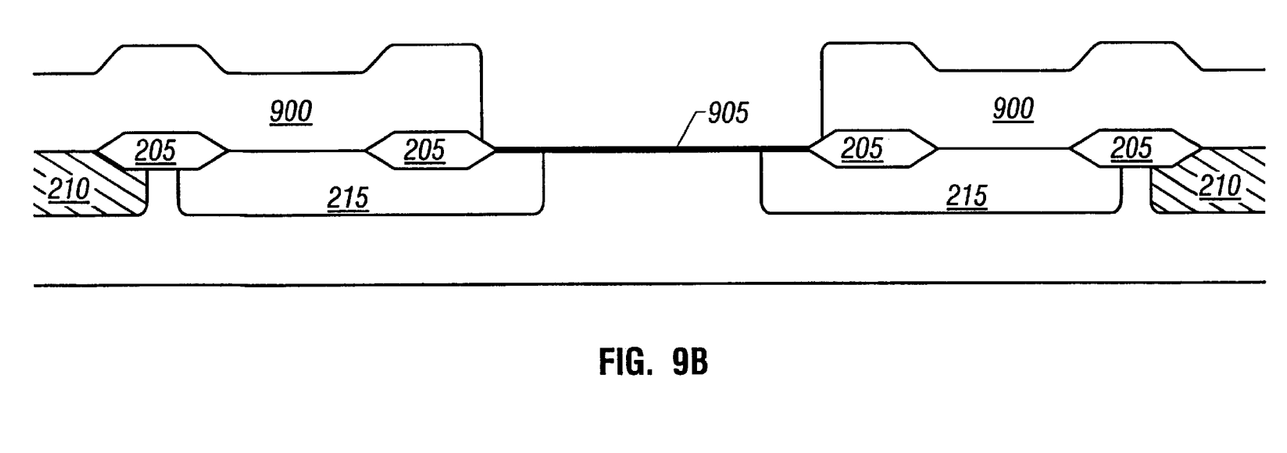

In yet another embodiment, the timed etch-back operation of FIGS. 4 through 7 is replaced with an oxide growth process, see FIGS. 8 and 9. Following step 110, a layer of silicon nitride 900 is deposited on the surface of the semiconductor (step 800). After the high voltage gate regions are exposed (step 400), the field region is etched and a layer of oxide is grown (step 805), and is typically 300 Å to 1000 Å using any convenient dry or wet oxide growth process. Following gate oxide formation, the silicon nitride is stripped (step 810) using any convenient stripping agent (e.g., phosphoric acid) and processing continues as described above (e.g., at step 115; see FIGS. 1, 4, and 6). One benefit of this approach is that the gate oxide thickness 905 can be better controlled than in an etch process. This added control, in turn, allows the design of a high voltage device with more tightly controlled electrical characteristics such as threshold voltage, current drive capability, and input capacitance. This embodiment retains all of the advantages, and can be modified in the same manner as the prior embodiments.

Figure 10:
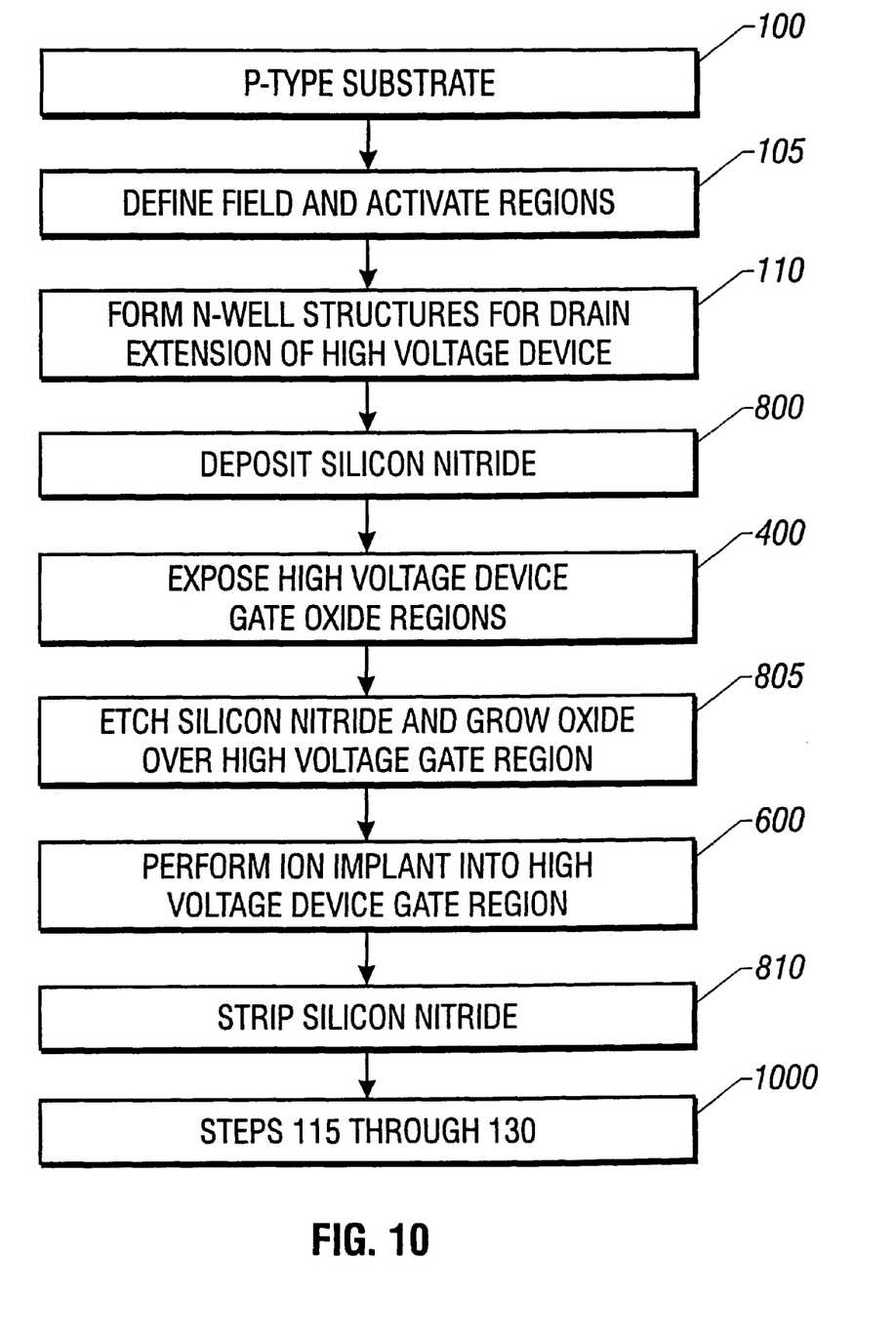
FIG. 10 shows yet another high voltage device fabrication process flow.

In yet another embodiment, see FIG. 10, a gate region implantation (step 600) is performed after the gate oxide has been grown, but before the silicon nitride has been stripped (step 810). Following the nitride strip, fabrication continues in accordance with step 115 through 130 as discussed above (step 1000).

In those embodiments using a gate region implantation (see, e.g., element 710 in FIG. 7), a typical silicon nitride layer of 800 Å to 2500 Å is sufficiently thick to stop implantation energies of up to approximately 100 KeV. If higher implantation energies are desired, the photoresist used to pattern the silicon nitride, which may be up to approximately 3 $\mu$m thick, may be left in place during implantation. (The gate region must be kept essentially clear of both the silicon nitride and photoresist.) The protection afforded the substrate by the photoresist in combination with the silicon nitride can shield the substrate from ion energies of up to approximately 2 MeV. Following implantation, the photoresist and silicon nitride may be stripped (using any convenient technique) and processing continued.

One of ordinary skill will recognize that many variations of the described processes may be made while still achieving fabrication of a high voltage device. For example: isolation (step 105) and well formation (step 110) steps may be done in reverse order—step 110 followed by step 105; a standard p-buried layer for epi replacement may be formed in the substrate 200 before any other steps (i.e., before step 105); channel stop implants can be formed in the high voltage device gate region (i.e., under the high voltage device gate filed oxide 205) to allow finer control over device threshold voltage or, alternatively, the substrate's bulk dopant level may be adjusted prior to fabrication to fulfill the same goal; gate region ion implantation may be performed either before or after a gate oxide is formed. In addition, a PMOS high voltage device may be formed by stating with an n-type substrate material, forming p-wells, and p+ source and drain regions. The embodiments described herein constitute exemplars only, other embodiments are within the scope of the following claims.

What is claimed is:

1. An integrated semiconductor circuit comprising:
   a semiconductor substrate having a first conductivity type;
   well regions of a first conductivity type and well regions of a second conductivity type formed in the substrate;
   low-voltage devices formed in well regions of the first conductivity type; and
   a high-voltage device including:
   source/drain regions of the second conductivity type formed, respectively, in well regions of the second conductivity type;
   an oxide region disposed on a surface of the substrate located above a region of the substrate that serves as a channel for the high voltage device, wherein the channel is implanted with a dopant of the first conductivity type so that the channel has a higher dopant concentration than the substrate; and
   a gate region disposed on the oxide region.

2. The integrated circuit of claim 1 further including field oxide regions disposed on the surface of the substrate, wherein the oxide region located above the channel comprises the same material as the field oxide regions.

3. The integrated circuit of claim 2 wherein the oxide region located above the channel has a thickness that is less than half a thickness of the field oxide regions.

4. The integrated circuit of claim 3 wherein the oxide region located above the channel has a thickness that is less than a quarter of the thickness of the field oxide regions.

5. The integrated circuit of claim 1 further including field oxide regions disposed on the surface of the substrate, wherein the oxide region located above the channel has a thickness that is less than half a thickness of the field oxide regions.

6. The integrated circuit of claim 5 wherein the oxide region located above the channel has a thickness that is less than a quarter of the thickness of the field oxide regions.

7. The integrated circuit of claim 1 wherein the low voltage devices formed in wells of the first conductivity type include devices having drain/source regions of the second conductivity type.

8. The integrated circuit of claim 1 wherein the low voltage devices can be operated with a power supply of five volts or less.

9. The integrated circuit of claim 1 wherein the high voltage device can be operated with a power supply of twelve volts or more.

10. The integrated circuit of claim 1 wherein the low voltage devices can be operated with a power supply of five volts or less, and wherein the high voltage device can be operated with a power supply of twelve volts or more.

11. The integrated circuit of claim 1 wherein some wells of the second conductivity type serve as source/drain regions for low voltage devices.

* * * * *